(12) United States Patent
Shibib et al.

(10) Patent No.: US 10,651,303 B2
(45) Date of Patent: May 12, 2020

(54) HIGH-ELECTRON-MOBILITY TRANSISTOR DEVICES

(71) Applicant: Vishay-Siliconix, San Jose, CA (US)

(72) Inventors: Ayman Shibib, San Jose, CA (US); Kyle Terrill, Santa Clara, CA (US)

(73) Assignee: Vishay Siliconix, LLC, San Jose, CA (US)

( * ) Notice: Subject to any disclaimer, the term of this patent is extended or adjusted under 35 U.S.C. 154(b) by 0 days.

(21) Appl. No.: 16/291,996

(22) Filed: Mar. 4, 2019

(65) Prior Publication Data

US 2019/0198651 A1 Jun. 27, 2019

Related U.S. Application Data

(63) Continuation of application No. 15/643,306, filed on Jul. 6, 2017, now Pat. No. 10,224,426.

(60) Provisional application No. 62/429,627, filed on Dec. 2, 2016.

(51) Int. Cl.

| | |
|---|---|
| *H01L 29/778* | (2006.01) |
| *H01L 29/205* | (2006.01) |
| *H01L 21/8252* | (2006.01) |
| *H01L 29/423* | (2006.01) |
| *H01L 29/861* | (2006.01) |
| H01L 29/20 | (2006.01) |
| H01L 29/10 | (2006.01) |
| H01L 29/207 | (2006.01) |

(52) U.S. Cl.
CPC ........ *H01L 29/778* (2013.01); *H01L 21/8252* (2013.01); *H01L 29/205* (2013.01); *H01L 29/4238* (2013.01); *H01L 29/42316* (2013.01); *H01L 29/7786* (2013.01); *H01L 29/861* (2013.01); *H01L 29/1066* (2013.01); *H01L 29/2003* (2013.01); *H01L 29/207* (2013.01); *H01L 29/42364* (2013.01)

(58) Field of Classification Search
CPC .. H01L 29/205; H01L 29/778; H01L 21/8252
USPC .......................................... 257/192, 194, 195
See application file for complete search history.

(56) References Cited

U.S. PATENT DOCUMENTS

| | | |
|---|---|---|
| 7,781,894 B2 | 8/2010 | Oikawa |
| 7,816,764 B2 | 10/2010 | Marchand et al. |
| 7,851,825 B2 | 12/2010 | Suh et al. |
| 7,898,004 B2 | 3/2011 | Wu et al. |
| 7,985,986 B2 | 7/2011 | Heikman et al. |
| 8,039,352 B2 | 10/2011 | Mishra et al. |
| 8,049,252 B2 | 11/2011 | Smith et al. |
| 8,114,717 B2 | 2/2012 | Palacios et al. |
| 8,390,027 B2 | 3/2013 | Iwamuro |

(Continued)

FOREIGN PATENT DOCUMENTS

EP 2779246 9/2014

OTHER PUBLICATIONS

Wuerfl et al., "Reliability issues of Gan based high voltage power devices", Microelectronics and Reliability, Elsevier Science Ltd., vol. 51, No. 9, Jul. 5, 2011, Berlin, Germany.

*Primary Examiner* — Matthew E Warren

(57) ABSTRACT

A device includes a first high electronic mobility transistor (HEMT) and a second HEMT. The first HEMT includes a first gate, a source coupled to the first gate, and a drain coupled to the first gate. The second HEMT includes a second gate coupled to the source and to the drain. The second HEMT has a lower threshold voltage than the first HEMT.

12 Claims, 7 Drawing Sheets

(56) References Cited

U.S. PATENT DOCUMENTS

| | | |
|---|---|---|
| 8,587,033 B1 | 11/2013 | Rieger et al. |
| 9,083,175 B2 | 7/2015 | Rouet |
| 9,142,543 B2 | 9/2015 | Katakura et al. |
| 9,331,472 B2 | 5/2016 | Huang et al. |
| 9,941,267 B2 | 4/2018 | Tsai |
| 10,224,426 B2 | 3/2019 | Shibib et al. |
| 2002/0020873 A1 | 2/2002 | Klodzinski |
| 2006/0108659 A1 | 5/2006 | Yanagihara et al. |
| 2008/0142837 A1 | 6/2008 | Sato et al. |
| 2008/0296618 A1 | 12/2008 | Suh et al. |
| 2009/0065785 A1 | 3/2009 | Beach |
| 2009/0140295 A1 | 6/2009 | Kaya et al. |
| 2009/0166677 A1 | 7/2009 | Shibata et al. |
| 2011/0101370 A1 | 5/2011 | Cheng et al. |
| 2011/0210337 A1 | 9/2011 | Briere |
| 2012/0007049 A1 | 1/2012 | Jeon et al. |
| 2012/0043586 A1 | 2/2012 | Nishimori et al. |
| 2012/0080724 A1* | 4/2012 | Iwabuchi .......... H01L 29/42316 257/194 |
| 2013/0088280 A1 | 4/2013 | Lal et al. |
| 2013/0153919 A1 | 6/2013 | Curatola et al. |
| 2014/0264453 A1 | 9/2014 | Moens et al. |
| 2014/0327043 A1 | 11/2014 | Kim |
| 2015/0069615 A1 | 3/2015 | Ohno et al. |
| 2017/0357283 A1 | 12/2017 | Adachi |
| 2018/0047719 A1 | 2/2018 | Vielemeyer et al. |
| 2018/0151681 A1 | 5/2018 | Lavanga et al. |
| 2018/0158942 A1 | 6/2018 | Shibib et al. |

\* cited by examiner

HIGH-ELECTRON-MOBILITY TRANSISTOR DEVICES

RELATED U.S. APPLICATIONS

This application is a continuation of the U.S. application by A. Shibib et al., entitled "High-Electron-Mobility Transistor Devices," Ser. No. 15/643,306, filed Jul. 6, 2017, which claims priority to the U.S. provisional application by A. Shibib et al., entitled "Psuedo-Schottky Structure in GaN and Method of Manufacturing," Ser. No. 62/429,627, filed Dec. 2, 2016, both of which are hereby incorporated by reference in their entirety.

BACKGROUND

A high-electron-mobility transistor (HEMT) is a field effect transistor (FET) that incorporates a junction between two materials with different band gaps as the channel instead of a doped region as is typically the case for metal-oxide semiconductor FETs (MOSFETs). HEMTs are characterized by low on-state resistance, high breakdown voltage, and low switching losses, making them excellent power devices (e.g., power amplifiers) in, for example, wireless communication systems.

In particular, HEMTs using gallium nitride (GaN) and aluminum GaN (AlGaN) on silicon substrates are highly efficient and thus very useful, not only in wireless communication systems but also in many other applications including voltage converters, for example.

Although GaN-based devices do not typically have a pn-junction and usually have fast reverse recovery compared to conventional silicon-based power transistors, when a GaN HEMT is operated in the reverse mode (when the drain-to-source voltage, Vds, goes negative), there can still be measurable switching losses. Depending on the reverse peak current, the reverse conduction mode voltage can go well above two volts, up to four volts or higher, for instance, thus contributing to power losses and reduced efficiency.

SUMMARY

Embodiments according to the present invention reduce switching losses and increase efficiency by reducing the reverse recovery time of an HEMT device, thereby also increasing the switching speed of the device. In these embodiments, this is achieved with a device structure that includes a main device and an additional low reverse-voltage device disposed essentially in parallel with the main device on a single integrated circuit or chip.

In an embodiment, to achieve low reverse-voltage, a low threshold voltage (Vth) HEMT is connected with a main HEMT on the chip. In such an embodiment, the low Vth HEMT is fully integrated with the main HEMT. That is, the main HEMT and the low Vth HEMT are connected in such a way that, for example, the drain of the low Vth HEMT is tied electrically to a separate gate, both the drain and gate of the low Vth HEMT are tied electrically to the source of the main HEMT, and the source of the low Vth HEMT is tied electrically to the drain of the main HEMT. Thus, the main HEMT has one gate, the low Vth HEMT has another gate, and the main HEMT and the low Vth HEMT share the same source and the same drain. Disclosed are different configurations for realizing a device structure that includes a main HEMT and an integrated low Vth HEMT.

In embodiments according to the present invention, the low Vth HEMT does not affect the leakage of the overall device, nor can it be triggered by drain coupling into the gate region because the low Vth HEMT is tied electrically to the source potential. The low Vth HEMT is activated only in the reverse mode of operation. Significantly, the low Vth HEMT does not interfere with the function of the main HEMT.

These and other objects and advantages of embodiments according to the present invention will be recognized by one skilled in the art after having read the following detailed description, which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention. Like numbers denote like elements throughout the drawings and specification. The figures may not be drawn to scale.

DETAILED DESCRIPTION

In the following detailed description of the present invention, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Some portions of the detailed descriptions that follow are presented in terms of procedures, logic blocks, processing, and other symbolic representations of operations for fabricating semiconductor devices. These descriptions and representations are the means used by those skilled in the art of semiconductor device fabrication to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing terms such as "growing," "removing," "forming," "connecting," "etching," "depositing," or the like, refer to actions and processes (e.g., the flowchart 600 of FIG. 6) of semiconductor device fabrication.

It is understood that the figures are not necessarily drawn to scale, and only portions of the devices and structures depicted, as well as the various layers that form those structures, are shown. For simplicity of discussion and illustration, processes may be described for one or two devices or structures, although in actuality more than one or two devices or structures may be formed.

Figure 1:
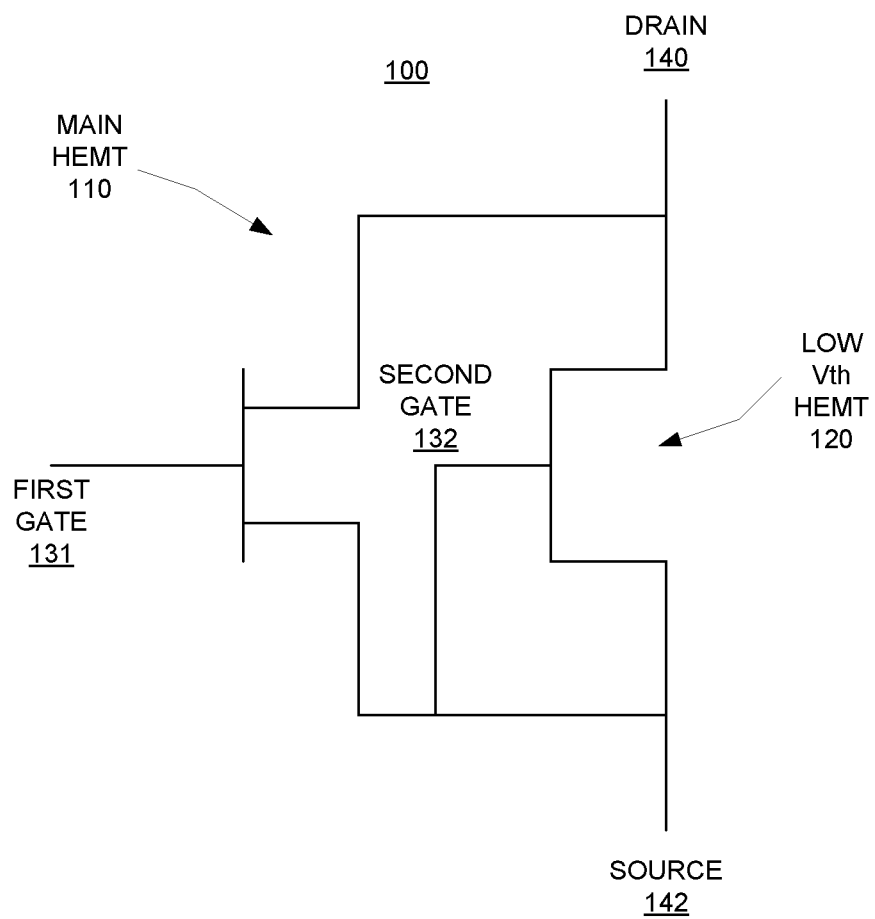
FIG. 1 illustrates a portion of a structure of a high-electron-mobility transistor (HEMT) device in embodiments according to the invention.

FIG. 1 illustrates a portion of a structure of a high-electron-mobility transistor (HEMT) device 100 in embodiments according to the present invention. In an embodiment, the structure is integrated into a single chip.

The HEMT device 100, which may be referred to herein as the overall HEMT device, includes at least a first HEMT 110 and a second HEMT 120. The HEMTs 110 and 120 may also be referred to as field effect transistors (FETs).

The first HEMT 110 may be referred to herein as a main HEMT. The second HEMT 120 has a lower threshold voltage (Vth) than the first HEMT device 110, and thus the second HEMT 120 may be referred to herein as a low Vth HEMT. The HEMT 120 may also be referred to as a pseudo-Schottky FET connected to the main HEMT 110, because it behaves like a diode with a relatively low turn-on voltage (e.g., relative to a conventional diode).

In an embodiment, the low Vth HEMT 120 has a higher threshold voltage in the forward conduction mode, but a much lower threshold voltage in the reverse conduction mode. In this embodiment, the HEMT device 100 is more immune to false gate trigger that may occur due to coupling of the drain voltage to the gate.

The main HEMT 110 includes a first gate 131, a drain or drain region 140, and a source or source region 142. The low Vth HEMT 120 includes a second gate 132, the drain 140, and the source 142. That is, the main HEMT 110 and the low Vth HEMT 120 are connected in such a way that the gate 132 of the low Vth HEMT is tied electrically to the drain 140 of the main HEMT, both the drain and gate of the low Vth HEMT are tied electrically to the source 142 of the main HEMT, and the source of the low Vth HEMT is tied electrically to the drain of the main HEMT. Thus, the main HEMT has one gate, the low Vth HEMT has another gate, and the main HEMT and the low Vth HEMT share the same source and the same drain. In an embodiment, the area occupied by the low Vth HEMT 120 is approximately five to 15 percent of the area occupied by the main HEMT 110.

In an embodiment, low Vth HEMTs are distributed among the main HEMTs. In other words, some of the main HEMTs in an array of such devices include an integrated low Vth HEMT while other main HEMTs do not include an integrated low Vth HEMT. Alternatively, all of the main HEMTs include an integrated low Vth HEMT.

In an embodiment, the low Vth HEMT 120 is off in normal operating mode, and is only turned on when the drain-to-source voltage (Vds) is negative (reverse mode). Advantageously, the low Vth HEMT 120 turns on in reverse mode faster than the main HEMT 110 and thereby permits current to flow at a lower voltage; the product of voltage and current (power) is therefore lower and consequently the power loss is also lower. Thus, the addition of the low Vth HEMT 120 in combination with the main HEMT 110 reduces switching losses and increases efficiency by reducing the reverse recovery time of the HEMT device 100, thereby increasing switching speed. Moreover, the low Vth HEMT 120 does not affect the leakage of the HEMT device 100, nor can it be triggered by drain coupling into the gate region because the low Vth HEMT is tied electrically to the source potential.

As about to be described, low Vth HEMTs can be implemented in a number of different ways. Consequently, embodiments according to the invention can be realized in different technologies as illustrated in the following examples. Embodiments according to the invention are not limited to these examples, and the concepts embodied herein can be incorporated into other technologies.

Figure 2A:
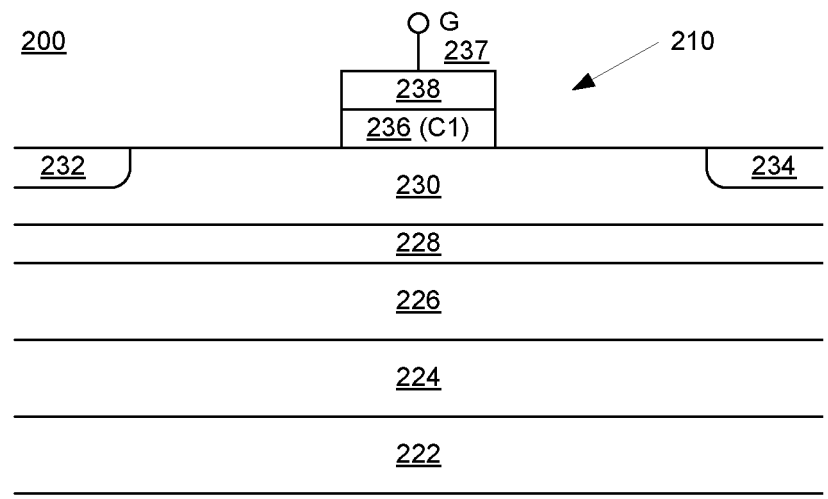
FIGS. 2A, 2B, and 2C illustrate an HEMT device including a main HEMT and a low threshold voltage (Vth) HEMT in embodiments according to the present invention.

FIG. 2A is a cross-sectional representation of an embodiment of a portion of an HEMT device 200 that includes a main HEMT 210 analogous to the main HEMT 110 of FIG. 1. In the FIG. 2A embodiment, the main HEMT 210 includes a source 232 and a drain 234. The main HEMT 210 also includes a first gate 237. The first gate 237 includes a doped region 236 and a contact 238. The contact 238 may be ohmic or it may be non-ohmic (e.g., it may be a Schottky contact).

The main HEMT 210 also includes a first layer 230 that includes gallium (Ga). In an embodiment, the first layer 230 is GaN-based (e.g., the first layer includes GaN). In one such embodiment, the layer 230 is a layer of aluminum GaN (AlGaN). Materials other than GaN-based materials, such as aluminum gallium arsenide (AlGaAs), may be utilized in place of AlGaN.

The source 232 and the drain 234 are formed in the first layer 230. A two-dimensional electron gas (2DEG) layer 228 is adjacent to the layer 230, and a second layer 226 is adjacent to the 2DEG layer. In an embodiment, the second layer 226 is composed of GaN, although the present invention is not so limited; for example, GaAs may be utilized in place of GaN. A buffer layer 224 is adjacent to the second layer 226, and a substrate (e.g., silicon) layer 222 is adjacent to the buffer layer. In an embodiment, the buffer layer 224 includes aluminum nitride and alternating layers of AlGaN and GaN. The alternating layers in the buffer layer 224 may have different thicknesses.

Figure 2B:
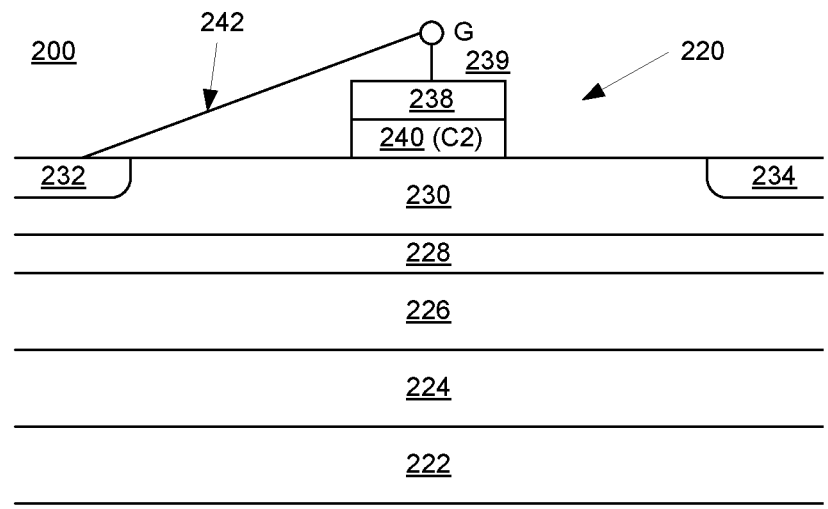

FIG. 2B is a cross-sectional representation of an embodiment of a portion of the HEMT device 200 that includes a low Vth HEMT 220 analogous to the low Vth HEMT 120 of FIG. 1. As noted above, the main HEMT 210 and the low Vth HEMT 220 are on the same chip and coupled as in FIG. 1 (also see FIG. 2C, discussed below). In the FIG. 2B embodiment, the low Vth HEMT 220 includes a second gate 239.

Significantly, the configuration (first configuration) of the first gate 237 and the first layer 230 is different from the configuration (second configuration) of the second gate 239 and the first layer 230. Specifically, the first gate 237 and the second gate 239 are different.

In the embodiment of FIG. 2A, the first gate 237 includes a first doped region 236 between the contact 238 and the first layer 230. The first doped region 236 is doped with a first concentration C1 of dopant. In an embodiment, the first doped region 236 is doped with a first concentration of p-type dopant. In one such embodiment, the p-type dopant is magnesium.

In the embodiment of FIG. 2B, the second gate includes a second doped region 240 between the contact 238 and the first layer 230. The second doped region 240 is doped with a second concentration C2 of dopant. In an embodiment, the second doped region 240 is doped with a second concentration of p-type dopant. In one such embodiment, the p-type dopant is magnesium.

Significantly, the second concentration C2 of dopant in the second doped region 240 is less than the first concentration C1 of dopant in the first doped region 236. That is, the concentration C2 of dopant in the second doped region 240 in the low Vth HEMT 220 is less than the concentration C1 of dopant in the first doped region 236 of the main HEMT 210. In an embodiment, the dopant concentration in the first doped region 236 is approximately $10^{18}$-$10^{19}$ per cubic centimeter (cm$^3$), and the dopant concentration in the second doped region 240 is approximately $10^{17}$ per cm$^3$. Generally speaking, for the range of dopant concentrations that may be used in practice, the dopant concentration in the first doped region 236 is at the highest or higher end of that range and the dopant concentration in the second doped region 240 is at the lowest or lower end of that range. In general, threshold voltage is proportional to the dopant concentration. Because the dopant concentration C2 in the second doped region 240 is less than the dopant concentration C1 in the first doped region 236, the threshold voltage of the HEMT 220 is less than that of the main HEMT 210.

Figure 2C:
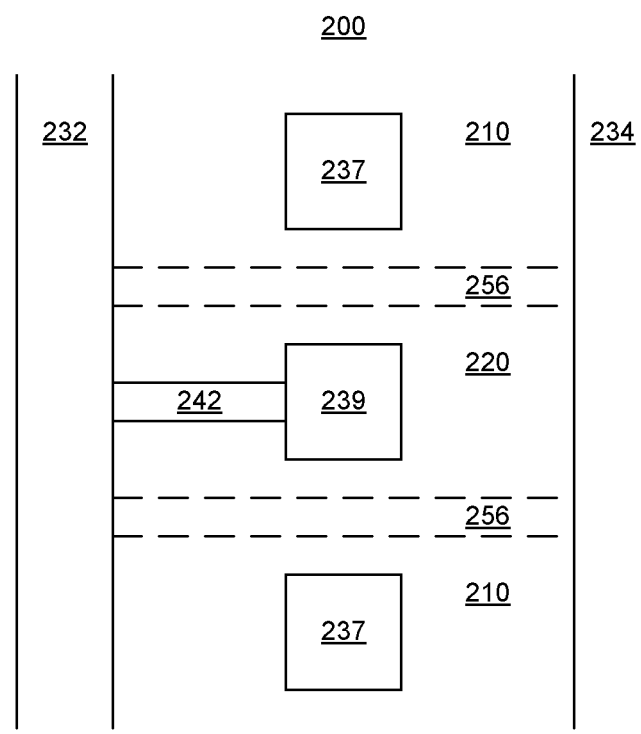

Furthermore, in an embodiment, the gate of the low Vth HEMT 220 is physically and electrically connected to the source 232 via a metal layer or interconnect 242. FIG. 2C is a representation of a top-down view of a portion of the HEMT device 200 in an embodiment according to the present invention. In the example of FIG. 2C, a low Vth HEMT 220 is located between two main HEMTs 210. The gates 237 of the main HEMTs 210 are isolated from the gate 239 of the low Vth HEMT 220 by isolation structures 256. The gate 239 of the low Vth HEMT 220 is physically and electrically connected to the source 232 by the metal layer or interconnect 242.

Figures 3A, 3C:
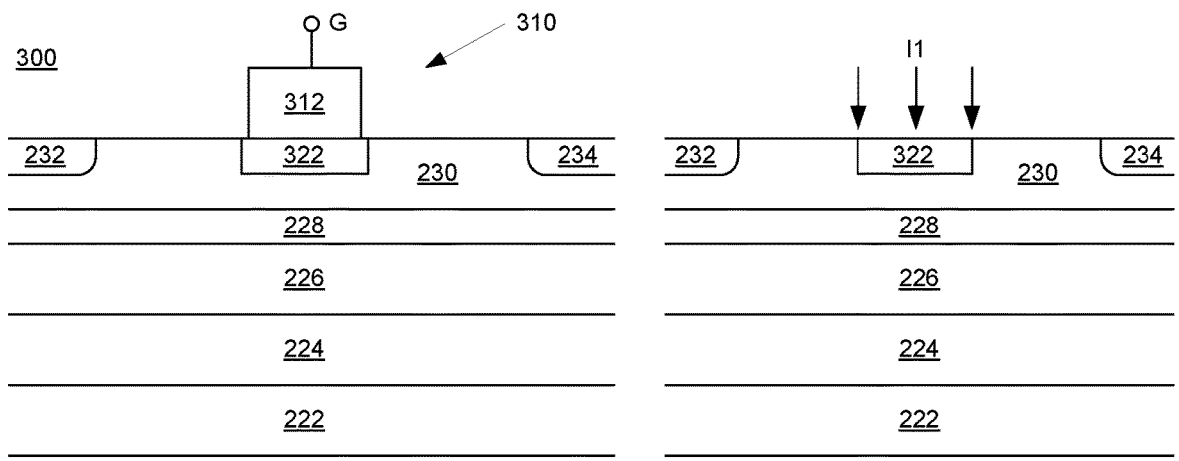
FIGS. 3A and 3B illustrate an HEMT device including a main HEMT and a low Vth HEMT in embodiments according to the present invention.
FIGS. 3C and 3D illustrate forming an HEMT device including a main HEMT and a low Vth HEMT in embodiments according to the present invention.
Figures 3B, 3D:
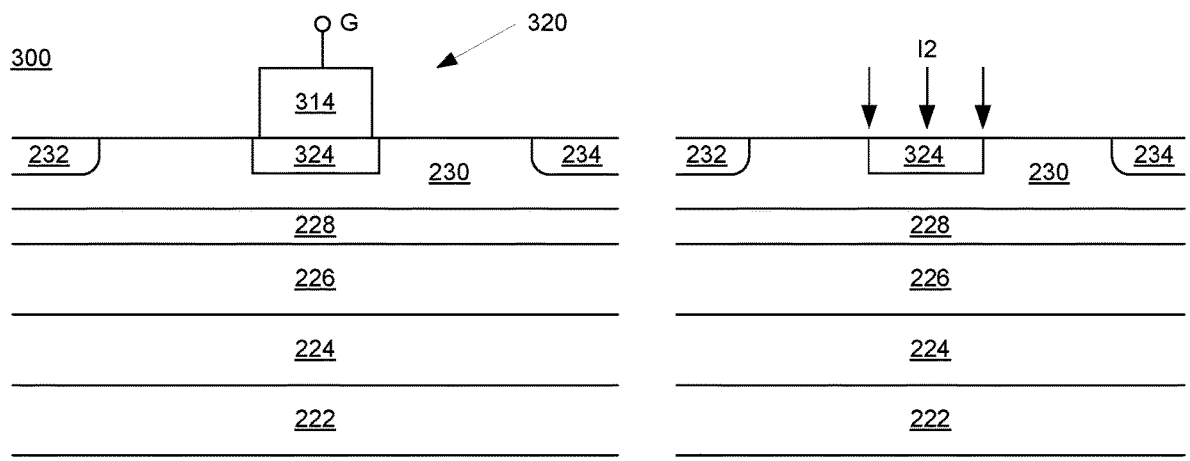

FIGS. 3A and 3B illustrate another way to realize low Vth HEMTs in embodiments according to the present invention. FIG. 3A is a cross-sectional representation of an embodiment of a portion of an HEMT device 300 that includes a main HEMT 310 analogous to the main HEMT 110 of FIG. 1. The HEMT device 300 includes a source 232, a drain 234, a first layer 230 (e.g., an AlGaN layer), a 2DEG layer 228, a second layer 226 (e.g., a GaN layer), a buffer layer 226, and a substrate layer 222 as previously described herein. In the FIG. 3A embodiment, the main HEMT 310 includes a first gate 312.

FIG. 3B is a cross-sectional representation of an embodiment of a portion of the HEMT device 300 that includes a low Vth HEMT 320 analogous to the low Vth HEMT 120 of FIG. 1. As noted above, the main HEMT 310 and the low Vth HEMT 320 are on the same chip and coupled as in FIG. 1. In the FIG. 3B embodiment, the low Vth HEMT device 320 includes a second gate 314.

In the embodiments of FIGS. 3A and 3B, the configuration (first configuration) of the first gate 312 and the first layer 230 is different from the configuration (second configuration) of the second gate 314 and the first layer 230. Specifically, the first layer 230 includes implant regions that are different for the main HEMT versus the low Vth HEMT.

In the embodiment of FIG. 3A, a first implant region 322 is disposed in the first layer 230 (e.g., the AlGaN layer) under the first gate 312. The first implant region 322 is formed by implanting a material into the layer 230 prior to formation of the first gate 312 as shown in FIG. 3C. In the embodiment of FIG. 3B, a second implant region 324 is disposed in the first layer 230 under the second gate 314. The second implant region 324 is formed by implanting a material into the layer 230 prior to formation of the second gate 314 as shown in FIG. 3D.

In an embodiment, the material implanted into the implant regions 322 and 324 is fluorine. Significantly, the implant dose I2 into the second implant region 324 is less than the implant dose I1 into the first implant region 322. That is, the implant dose I2 in the second implant region 324 in the low Vth HEMT 320 is less than the implant dose I1 in the in the first implant region 322 of the main HEMT 310. In an embodiment, the implant dose in the first implant region 322 is approximately $10^{14}$ per square centimeter (cm$^2$), and the implant dose in the second implant region 324 is approximately $10^{12}$ per cm$^2$. Generally speaking, for the range of implant doses that may be used in practice, the implant dose in the first implant region 322 is at the highest or higher end of that range and the implant dose in the second implant region 324 is at the lowest or lower end of that range. In general, threshold voltage is proportional to the implant dose. Because the implant dose I2 in the second implant region 324 is less than the implant dose I1 in the first implant region 322, the threshold voltage of the HEMT 320 is less than that of the main HEMT 310.

Figure 4A:
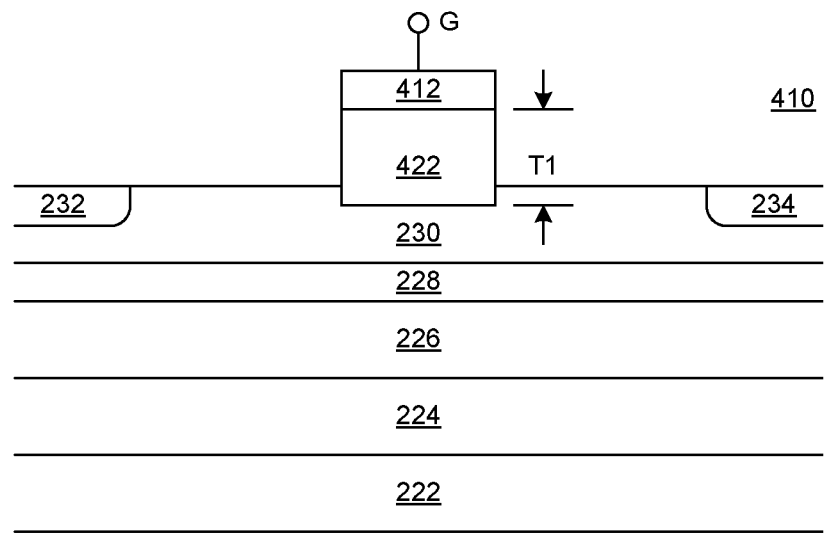
FIGS. 4A and 4B illustrate an HEMT device including a main HEMT and a low Vth HEMT in embodiments according to the present invention.
Figure 4B:
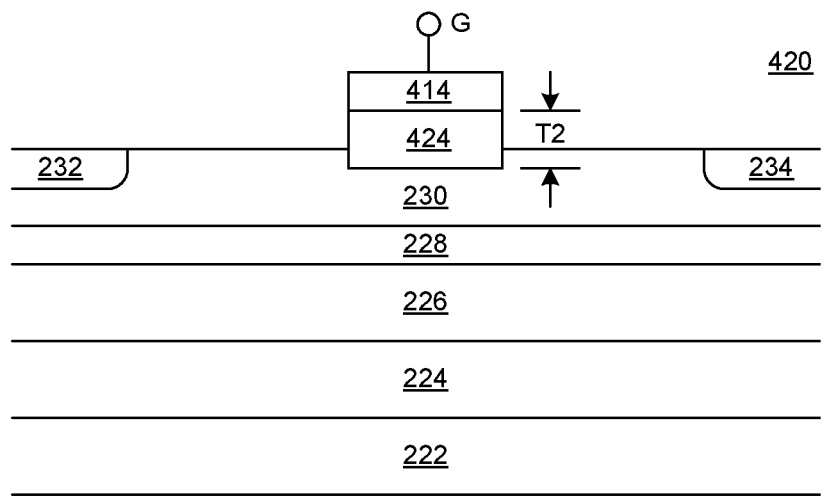

FIGS. 4A and 4B illustrate another way to realize low Vth HEMTs in embodiments according to the present invention. FIG. 4A is a cross-sectional representation of an embodiment of a portion of an HEMT device 400 that includes a main HEMT 410 analogous to the main HEMT 110 of FIG. 1. The HEMT device 400 includes a source 232, a drain 234, a first layer 230 (e.g., an AlGaN layer), a 2DEG layer 228, a second layer 226 (e.g., a GaN layer), a buffer layer 226, and a substrate layer 222 as previously described herein. In the FIG. 4A embodiment, the main HEMT 410 includes a first gate 412.

FIG. 4B is a cross-sectional representation of an embodiment of a portion of the HEMT device 400 that includes a low Vth HEMT 420 analogous to the low Vth HEMT 120 of FIG. 1. As noted above, the main HEMT 410 and the low Vth HEMT 420 are on the same chip and coupled as in FIG. 1. In the FIG. 4B embodiment, the low Vth HEMT device 420 includes a second gate 414.

Significantly, the configuration (first configuration) of the first gate 412 and the first layer 230 is different from the configuration (second configuration) of the second gate 414 and the first layer 230. Specifically, insulators that are different for the main HEMT versus the low Vth HEMT are included between the respective gates and the first layer 230.

In the embodiment of FIG. 4A, a first insulator 422 is disposed between the first gate 412 and the first layer 230. The first insulator 422 has a first thickness T1. In an embodiment, the first insulator 422 is at least partially embedded into the first layer 230.

In the embodiment of FIG. 4B, a second insulator 424 is disposed between the second gate 414 and the first layer 230. The second insulator 424 has a second thickness T2. In an embodiment, the second insulator 424 is at least partially embedded into the first layer 230. The insulators 422 and 424 can be, for example, aluminum oxide ($Al_2O_3$) or silicon dioxide ($SiO_2$).

Significantly, the second thickness T2 is less than the first thickness T1. That is, the thickness of the insulator 424 in the low Vth HEMT 420 is less than the thickness of the insulator 422 in the main HEMT 410. In an embodiment, the thickness T2 is about an order of magnitude less than the thickness T1. For example, the thickness T1 of the insulator 422 may be approximately 1000 Angstroms, and the thickness T2 of the insulator 424 may be approximately 200 Angstroms. In general, threshold voltage is proportional to the thickness of the insulator. Because the insulator 424 is thinner than the insulator 422, the threshold voltage of the HEMT 420 is less than that of the main HEMT 410.

Figure 5A:
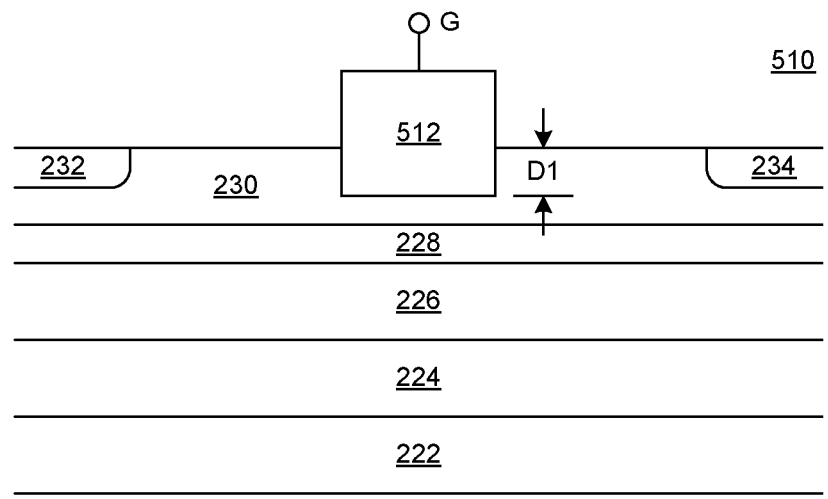
FIGS. 5A and 5B illustrate an HEMT device including a main HEMT and a low Vth HEMT in embodiments according to the present invention.
Figure 5B:
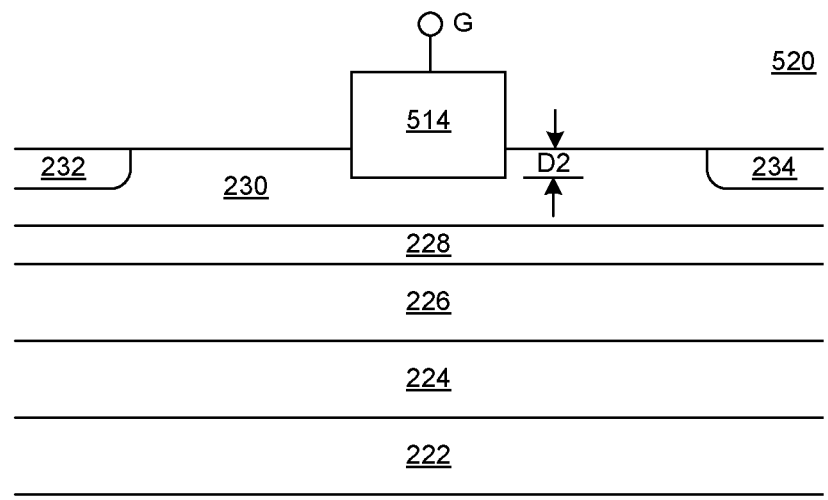

FIGS. 5A and 5B illustrate another way to realize low Vth HEMTs (e.g., in a Schottky metal-semiconductor FET (MESFET)) in embodiments according to the present invention. FIG. 5A is a cross-sectional representation of an embodiment of a portion of an HEMT device 500 that includes a main HEMT 510 analogous to the main HEMT 110 of FIG. 1. The HEMT device 500 includes a source 232, a drain 234, a first layer 230 (e.g., an AlGaN layer), a 2DEG layer 228, a second layer 226 (e.g., a GaN layer), a buffer layer 226, and a substrate layer 222 as previously described herein. In the FIG. 5A embodiment, the main HEMT 510 includes a first metal gate 512.

FIG. 5B is a cross-sectional representation of an embodiment of a portion of the HEMT device 500 that includes a low Vth HEMT 520 analogous to the low Vth HEMT 120 of FIG. 1. As noted above, the main HEMT 510 and the low Vth HEMT 520 are on the same chip and coupled as in FIG. 1. In the FIG. 5B embodiment, the low Vth HEMT device 520 includes a second metal gate 514.

However, the configuration (first configuration) of the first gate 512 and the first layer 230 is different from the configuration (second configuration) of the second gate 514 and the first layer 230. Specifically, in the embodiments of FIGS. 5A and 5B, the first gate 512 is recessed to a first depth D1 into the first layer 230, and the second gate 514 is recessed to a second depth D2 into the first layer 230.

Significantly, the second depth D2 is less than the first depth D1. As a result, the thickness of the first layer 230 under the second gate 514 in the low Vth HEMT 520 is less than the thickness of the first layer 230 under the gate 512 in the main HEMT 510. In general, threshold voltage is proportional to the depth of the recess. Because the depth D2 of the recess into the first layer 230 of the second gate 514 is less than the depth D1 of the recess of the second gate 512 into the first layer 230, the threshold voltage of the HEMT 520 is less than that of the main HEMT 510.

Figure 6:
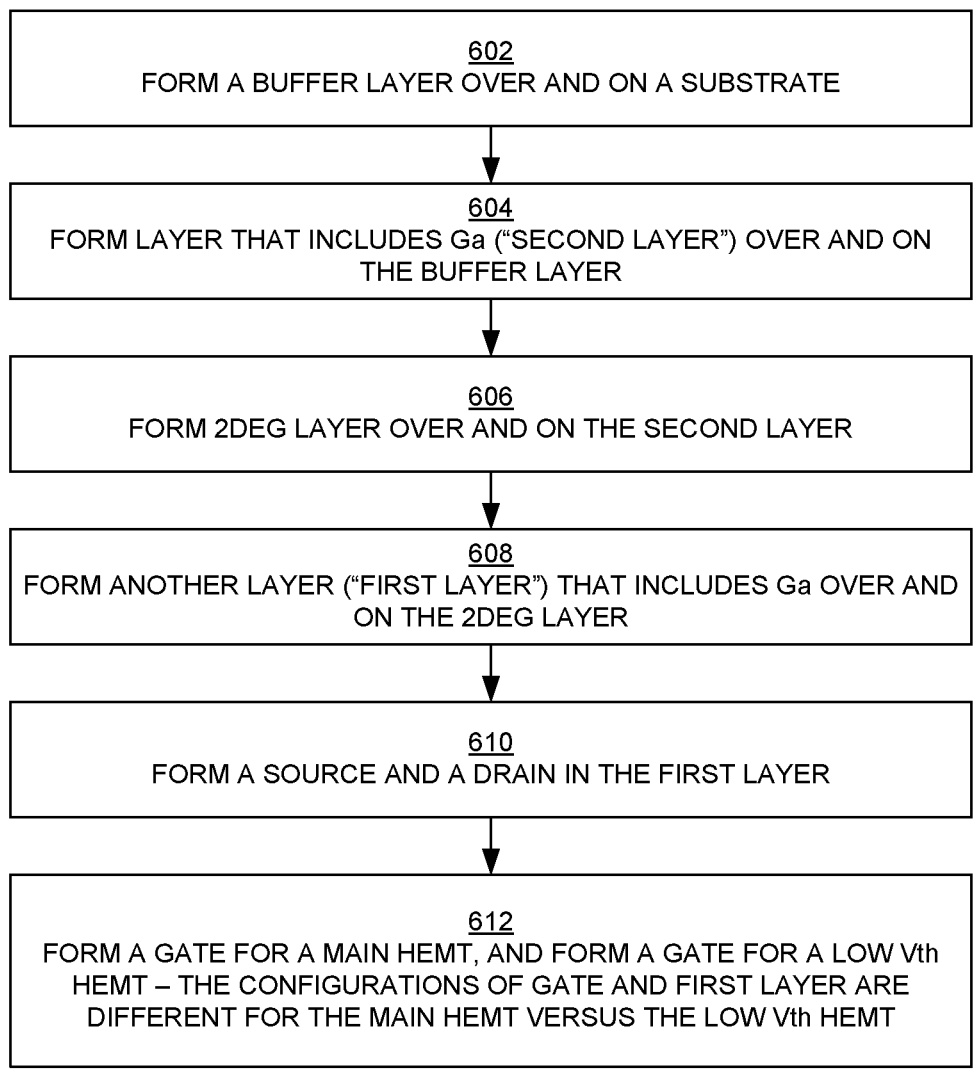
FIG. 6 is a flowchart of an example of a method for fabricating an HEMT device in embodiments according to the present invention.

FIG. 6 is a flowchart 600 of an example of a method or process for fabricating HEMT devices (e.g., the devices of FIGS. 1, 2A, 2B, 3A, 3B, 4A, 4B, 5A, and 5B) in embodiments according to the present invention. FIG. 6 is discussed in the context of a single HEMT device that includes a main HEMT and a low Vth HEMT, but can be readily extended to the fabrication in parallel of multiple such devices.

In FIG. 6, operations described as separate blocks may be combined and performed in the same process step (that is, in the same time interval, after the preceding process step and before the next process step). Also, the operations may be performed in a different order than the order in which they are described below. Furthermore, fabrication processes and steps may be performed along with the processes and steps discussed herein; that is, there may be a number of process steps before, in between, and/or after the steps shown and described herein. Importantly, embodiments according to the present invention can be implemented in conjunction with these other (perhaps conventional) processes and steps without significantly perturbing them. Generally speaking, embodiments according to the present invention can replace portions of a conventional process without significantly affecting peripheral processes and steps.

In block 602, a buffer layer is formed over and on a substrate (e.g., a silicon substrate).

In block 604, a layer that includes Ga (the second layer 226 of FIG. 2A, for example) is formed over and on the buffer layer. In an embodiment, this layer includes GaN.

In block 606 of FIG. 6, a 2DEG layer is formed over and on the layer formed in block 604.

In block 608, a layer that includes Ga (the first layer 230 of FIG. 2A, for example) is formed over the 2DEG layer. In an embodiment, this layer includes AlGaN.

In block 610, a source and a drain are formed in the layer formed in block 608.

In block 612, a gate or gate structure for the main HEMT, and a gate or gate structure for the low Vth HEMT, are formed. Significantly, the configuration (first configuration) of the gate for the main HEMT and the layer formed in block 608 (referred to hereafter as the first layer) is different from the configuration (second configuration) of the gate for the low Vth HEMT and the first layer. The first configuration and the second configuration can be formed in parallel (during the same process steps), although the present invention is not so limited.

With reference to the embodiments of FIGS. 2A, 2B, and 2C, the process steps included in block 612 include depositing a first concentration of dopant in the gate 237 to form a first doped region 236 and depositing a second concentration of dopant in the gate 239 to form a second doped region 240, where the second concentration is less than the first concentration. Furthermore, in an embodiment, the process steps included in block 602 include forming a metal connection between the gate 239 and the source.

With reference to the embodiments of FIGS. 3A and 3B, the process steps included in block 612 include, prior to forming the gate 312, implanting a first dose of an implant material to form a first implant region 322 in the first layer 230 and then forming the gate 312 over the first implant region. The process steps included in block 612 also include, prior to forming the gate 314, implanting a second dose of the implant material to form a second implant region 324 in the first layer 230 and then forming the gate 314 over the second implant region, where the second dose is less than the first dose.

With reference to the embodiments of FIGS. 4A and 4B, the process steps included in block 612 include, prior to forming the gate 412, forming a recess in the first layer 230 and forming a first insulator 422 in and extending from the recess so that the first insulator has a first thickness and is at least partially embedded in the first layer, and then forming the gate 412 over the first insulator. The process steps included in block 612 also include, prior to forming the gate 414, forming another recess in the first layer 230 and forming a second insulator 424 in and extending from that recess so that the second insulator has a second thickness and is at least partially embedded in the first layer, where the second thickness is less than the first thickness.

With reference to the embodiments of FIGS. 5A and 5B, the process steps included in block 612 include, prior to forming the gate 512, forming a recess having a first depth in the first layer 230 and then depositing and forming metal in and extending from the recess to form the gate 512. The process steps included in block 612 also include, prior to forming the gate 514, forming another recess having a second depth in the first layer 230 and then depositing and forming metal in and extending from that recess to form the gate 514, where the second depth is less than the first depth.

In summary, in embodiments according to the present invention, an HEMT device structure includes a main HEMT and an additional low Vth HEMT essentially in parallel with the main HEMT on a single chip. Different types of HEMT devices can be fabricated according to the type of HEMT technology incorporated in the device, as exemplified in the embodiments of FIGS. 2A, 2B, 3A, 3B, 4A, 4B, 5A, and 5B. Embodiments of the HEMT device structure disclosed herein reduce switching losses and increase efficiency by reducing the reverse recovery time of an HEMT device, thereby also increasing switching speed.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method for fabricating a high electron mobility transistor (HEMT) device, the method comprising:
   forming a first HEMT on a substrate, the first HEMT comprising a first gate, a source coupled to the first gate, and a drain coupled to the first gate, wherein the first gate comprises a first contact and is disposed on a layer comprising gallium;
   forming a second HEMT on the substrate, the second HEMT comprising a second gate coupled to the source and to the drain, wherein the second gate comprises a second contact and is disposed on the layer comprising gallium;
   depositing a first concentration of dopant in the first gate to form a first doped region between the first contact and the layer comprising gallium; and
   depositing a second concentration of dopant in the second gate to form a second doped region between the second contact and the layer comprising gallium;
   wherein the second concentration is less than the first concentration; and
   wherein the second HEMT has a lower threshold voltage than the first HEMT.

2. The method of claim 1, wherein said forming the first HEMT and said forming the second HEMT comprise:
   forming a buffer layer over the substrate;
   forming a layer comprising gallium nitride (GaN) over the buffer layer, wherein a two-dimensional electron gas (2DEG) layer is subsequently formed in the layer comprising GaN;
   forming the layer comprising gallium by forming a layer comprising aluminum gallium nitride (AlGaN) over the layer comprising GaN;
   forming the source and the drain in the layer comprising AlGaN;
   forming the first gate above the layer comprising AlGaN; and
   forming the second gate above the layer comprising AlGaN.

3. The method of claim 1, wherein the dopant is a p-type dopant.

4. The method of claim 1, further comprising forming a metal connection between the second gate and the source.

5. A method for fabricating a high electron mobility transistor (HEMT) device, the method comprising:
   forming a first HEMT on a substrate, the first HEMT comprising a first gate, a source coupled to the first gate, and a drain coupled to the first gate, wherein the first gate is disposed on a layer comprising gallium, and wherein said forming the first HEMT comprises:
      prior to said forming the first gate, implanting a first dose of an implant material to form a first implant region in the layer comprising gallium, wherein the first gate is then formed over the first implant region; and
   forming a second HEMT on the substrate, the second HEMT comprising a second gate coupled to the source and to the drain, wherein the second gate is disposed on a layer comprising gallium, and wherein said forming the second HEMT comprises:
      prior to forming the second gate, implanting a second dose of the implant material to form a second implant region in the layer comprising gallium, wherein the second gate is then formed over the second implant region;
   wherein the second dose is less than the first dose; and
   wherein the second HEMT has a lower threshold voltage than the first HEMT.

6. The method of claim 5, wherein said forming the first HEMT and said forming the second HEMT comprise:
   forming a buffer layer over the substrate;
   forming a layer comprising gallium nitride (GaN) over the buffer layer, wherein a two-dimensional electron gas (2DEG) layer is subsequently formed in the layer comprising GaN;
   forming the layer comprising gallium by forming a layer comprising aluminum gallium nitride (AlGaN) over the layer comprising GaN;
   forming the source and the drain in the layer comprising AlGaN;
   forming the first gate above the layer comprising AlGaN; and
   forming the second gate above the layer comprising AlGaN.

7. The method of claim 5, wherein the implant material comprises fluorine.

8. The method of claim 5, wherein the first dose and the second dose are in a range between $10^{12}$ per square centimeter and $10^{14}$ per square centimeter.

9. A method for fabricating a high electron mobility transistor (HEMT) device, the method comprising:
   forming a first HEMT on a substrate, the first HEMT comprising a first gate, a source coupled to the first gate, and a drain coupled to the first gate, wherein the first gate is disposed on a layer comprising gallium, and wherein said forming the first HEMT comprises:
      prior to forming the first gate, forming a first recess in the layer comprising gallium; and
      forming a first insulator in and extending from the first recess so that the first insulator has a first thickness and is at least partially embedded in the layer comprising gallium, wherein the first gate is then formed over the first insulator; and
   forming a second HEMT on the substrate, the second HEMT comprising a second gate coupled to the source and to the drain, wherein the second gate is disposed on a layer comprising gallium, and wherein said forming the second HEMT comprises:
      prior to forming the second gate, forming a second recess in the layer comprising gallium; and
      forming a second insulator in and extending from the second recess so that the second insulator has a second thickness and is at least partially embedded in the layer comprising gallium, wherein the second gate is then formed over the second insulator;
   wherein the second thickness is less than the first thickness; and wherein the second HEMT has a lower threshold voltage than the first HEMT.

10. The method of claim 9, wherein said forming the first HEMT and said forming the second HEMT comprise:

forming a buffer layer over the substrate;

forming a layer comprising gallium nitride (GaN) over the buffer layer, wherein a two-dimensional electron gas (2DEG) layer is subsequently formed in the layer comprising GaN;

forming the layer comprising gallium by forming a layer comprising aluminum gallium nitride (AlGaN) over the layer comprising GaN;

forming the source and the drain in the layer comprising AlGaN;

forming the first gate above the layer comprising AlGaN; and forming the second gate above the layer comprising AlGaN.

11. The method of claim 9, wherein the insulating material is selected from the group consisting of: aluminum oxide ($Al_2O_3$), and silicon dioxide ($SiO_2$).

12. The method of claim 9, wherein the first thickness and the second thickness are in a range between 200 Angstroms and 1000 Angstroms.

* * * * *